United States Patent [19]

Weaver et al.

[11] 4,410,395

[45] Oct. 18, 1983

[54] METHOD OF REMOVING BULK IMPURITIES FROM SEMICONDUCTOR WAFERS

[75] Inventors: Charles H. Weaver, Santa Rosa; Bela L. Kaltenekker, Healdsburg, both of Calif.

[73] Assignee: Fairchild Camera & Instrument Corporation, Mountain View, Calif.

[21] Appl. No.: 376,890

[22] Filed: May 10, 1982

[51] Int. Cl.³ .................... H01L 21/306; B44C 1/22; C03C 15/00; C03C 25/06
[52] U.S. Cl. ................................ 156/662; 156/645; 252/79.3; 252/79.4
[58] Field of Search .................. 156/636, 645, 662; 148/1.5, 191; 29/580; 252/79.3, 79.4

[56] References Cited

U.S. PATENT DOCUMENTS 3,923,567 12/1975 Lawrence ........................... 156/626
4,144,099 3/1979 Edmonds et al. ............... 156/645 X
4,276,114 6/1981 Takano et al. ................... 156/636 X

*Primary Examiner*—William A. Powell
*Attorney, Agent, or Firm*—Kenneth Olsen; Warren M. Becker; Carl L. Silverman

[57] ABSTRACT

A method of removing bulk impurities from a semiconductor wafer is described comprising the steps of lapping the front and back surfaces of the wafer to remove 35 to 40 microns of material therefrom and to make the surfaces parallel, heating the wafer at a predetermined temperature preferably equal to or above the highest temperature to be used in subsequent device fabrication, etching the front and back surfaces of the wafer to remove 35 to 40 microns of material therefrom and thereafter polishing the front surface of the wafer for removing 20 microns of material therefrom. By means of the above process the number of surface defects caused by strain producing centers in the crystal lattice of the wafer is reduced from 500,000 defects per square centimeter to less than 1,000 defects per square centimeter.

10 Claims, No Drawings

METHOD OF REMOVING BULK IMPURITIES FROM SEMICONDUCTOR WAFERS

The present invention relates to the fabrication of semiconductor wafers in general and in particular to a method for removing fast diffusing bulk impurities from a semiconductor wafer.

BACKGROUND OF THE INVENTION

Semiconductor wafers, such as silicon semiconductor wafers, are employed as substrates in the fabrication of a wide variety of integrated circuit semiconductor devices. To make the wafers, bulk silicon material is first melted in a quartz crucible in a high temperature crystal growing furnace. A piece of single crystal silicon, called a seed crystal, is attached to the end of a rod and then caused to contact the melted silicon material in the crucible. The seed is then slowly lifted while the silicon melt is slowly rotated relative thereto. As the seed is lifted, an elongated cylinder of single crystalline silicon is formed. This process is called crystal growing. After a rod of sufficient length of single crystalline silicon is grown, the rod is removed from the crystal growing furnace and placed in a wafer slicing machine.

In the wafer slicing machine wafers having a thickness of approximately 600 microns are cut from the rod. These wafers are subsequently used as substrate material in the fabrication of integrated circuit semiconductor devices.

The quality of the semiconductor wafers plays an important role in both integrated circuit device fabrication yields and processing difficulties. Among the factors relating to the quality of the substrate material, one has to do with the number of bulk impurities in the substrate material. Depending on their number, character and location in the wafer, some bulk impurities cause serious defects in the wafer. These bulk impurities come from a number of sources. For example, the bulk silicon material used in forming the single crystal rod described above contains impurities. As the rod is grown additional impurities enter the rod due to reactions between the melted silicon material and the quartz crucible in which the material is melted. These bulk impurities, if permitted to migrate toward the active surface of a wafer during device fabrication, cause defects in the wafer which adversely affect the operation of devices made from the wafer.

One measure of wafer quality is the density of shallow etch pits exposed by preferential etching of the active or polished surface of a wafer following initial oxidation. The etch pits are caused by strain producing centers which weaken the atomic binding energy of a crystal lattice. These surface defects result from impurities in the bulk of the wafer diffusing or gettering toward the surface of the wafer during high temperature processing of the wafer. It is generally understood that the bulk impurities tend to concentrate in the vicinity of defects in the crystal lattice wherein the atomic binding energy is lowest. When the defects occur on or near the surface of the substrate material, the defects are found to have their greatest dilatorious affect on subsequent device fabrication yields and operation.

Heretofore, processes which have been employed for removing or reducing the impurity levels related to strain centers from the active or polished side of silicon wafers have included backside damage processes to getter the contaminants to the backside of the silicon wafer and processes including exposure of the wafer to a phosphorous heat cycle. It has been found, however, that the use of both of these processes have not been entirely successful. This has been due to the fact that high temperatures used during subsequent wafer processing causes the impurities collected on the back surface of the semiconductor wafer to redistribute through the bulk of the wafer and reappear in unacceptably high numbers on the polished surface of the wafer. The number of such defects has been found, using conventional preferential etching to be as high as 500,000 defects per square centimeter. This high number of defects seriously affects device yields.

SUMMARY OF THE INVENTION

In view of the foregoing a principal object of the present invention is a method for removing bulk impurities from semiconductor wafers such that the number of defects exposed by preferential etching after initial oxidation of the polished wafer is significantly reduced from the 500,000 defects per square centimeter obtained using prior known wafer processing techniques.

Still another object of the present invention is a method of fabricating semiconductor wafers for use as substrates in the fabrication of integrated circuit semiconductor devices which permits the fabrication of such devices using conventional device processing techniques.

To reduce the number of defects which appear on the polished surface of a semiconductor wafer in accordance with the present invention, there is provided a novel method for heating a wafer and removing in separate steps predetermined amounts of material from the front and back surfaces thereof. More specifically, conventional lapping techniques are first used to remove a predetermined amount of material from the front and back surfaces of the semiconductor wafer to remove physical damage caused to the surface of the wafer as a consequence of slicing the wafer from the ingot and to make the surfaces parallel to within a predetermined degree of parallelism. Thereafter, the wafer is heated at a predetermined temperature for a predetermined period of time. The heating of the wafer getters the impurities on the front and back surfaces of the wafer. That is, the heating causes the bulk impurities to migrate to and concentrate at locations of minimum atomic binding energy in the crystal lattice. After the gettering process is completed the front and back surfaces are etched for removing a second predetermined thickness of the material of the wafer from the front and back surfaces. After the etching process is completed, the front or active surface of the wafer is polished by removing a third predetermined thickness of the material of the wafer from the front surface.

In quality assurance tests, following the above-described processing of the wafer, preferential etching following an initial oxidation using conventional etching compounds, the composition of which depends on the orientation of the crystalline silicon, was used to measure the number of surface defects remaining in the wafer. It was found in the tests that the number of defects, which appear as shallow etched pits exposed by the preferential etching, was reduced from 500,000 defects per square centimeter to less than 1,000 defects per square centimeter.

The above and other objects features and advantages of the present invention will become apparent to those skilled in the art from the following detailed description thereof.

DETAILED DESCRIPTION OF THE INVENTION

In accordance with the present invention, a silicon semiconductor wafer is obtained having an initial thickness of approximately 600 microns. The semiconductor wafer is obtained from a cylinder of single crystalline silicon which is grown and sliced using conventional crystal growing and slicing techniques. The wafer thus obtained is then placed in a conventional lapping machine. The front and back surfaces of the wafer are then lapped for a sufficient length of time to remove a first predetermined thickness of approximately 35 to 40 microns from the front and back surfaces and to make the surfaces parallel to each other within a predetermined degree of parallelism as of, for example, two microns. After the front and back surfaces are lapped as described above, the wafer is then heated at a predetermined temperature for a predetermined period of time. Preferably, the predetermined temperature is equal to or higher than the temperature to which the wafer will be subjected during subsequent processing and device fabrication. The predetermined period of time that the wafer is heated depends on the heating temperature. Tests have shown that for a temperature of 1,050 degrees Centigrade, the heating period is approximately three to four hours. At a temperature of 1,250 degrees Centigrade, the heating period is reduced to one hour. During the heating of the wafer, the bulk impurities migrate to strain produced centers in the crystal which weaken the atomic binding energy of the crystal lattice. It has been found through extensive testing that the bulk impurities tend to concentrate near the front and back surfaces of the wafer until a saturation point is reached. Therefter, the impurities are trapped at deeper locations in the bulk of the wafer. For commercially available bulk silicon material typically used in growing single crystalline silicon, tests show that undesirable levels of contamination extend 30 to 40 microns into the wafer from the front and rear surfaces thereof.

Following the heating or gettering of the impurities to the front and back surfaces of the wafer, the wafer front and back surfaces are etched using conventional silicon etching compositions. Such compositions comprise, for example, compositions of two parts nitric acid, one part hydrogen fluoride and two parts acetic acid. The etching is carried out for a time sufficient to remove a second predetermined thickness of approximately 35 to 40 microns of the wafer material from its front and back surfaces. After the etching process is completed the front surface of the wafer is then polished using conventional silicon polishing apparatus and compounds. The polishing is done for removing a third predetermined thickness of approximately 20 microns of material from the front surface.

With wafers made using the lapping, heating, etching, and polishing processes described above, tests show that the number of surface impurities caused by strain producing centers in the wafer material are reduced from 500,000 defects per square centimeter to less than 1,000 defects per square centimeter.

With this significant reduction in surface impurities, it has been found that device fabrication yields are significantly increased and device processing difficulties significantly reduced.

While a preferred embodiment of the present invention is described, it is contemplated that each of the steps of the process described may be modified within certain limits depending upon the starting materials used and the subsequent device fabrication processing employed without departing from the spirit and scope of the present invention. For example, if the number of impurities in the initial bulk silicon material used in growing the single crystalline silicon rods is significantly reduced, the amount of material which is removed from a silicon wafer during the lapping, etching and polishing processes, the gettering temperature and periods for each step may be reduced. Similarly, the heating temperature of the wafer during the gettering process may be substantially above the temperature employed during device fabrication if it is desired to hasten the gettering. However, care must be taken so as not to exceed that temperature and heating period which causes other defects to appear in the surface of the wafer. For these reasons, it is intended that the scope of the present invention not be limited to the embodiments described, but be determined by reference to the claims hereinafter provided and their equivalence.

What is claimed is:

1. A method of removing bulk impurities from a semiconductor wafer comprising the steps of:
   lapping the front and back surfaces of said wafer for removing damage caused to said surfaces during slicing of said wafer from an ingot and for making said surfaces parallel to within a predetermined degree of parallelism;
   heating said wafer at a predetermined temperature for a predetermined period of time after said step of lapping without any intermediate step of intentionally damaging either surface of said wafer for causing said bulk impurities to migrate substantially equally to said front and back surfaces of said wafer;
   etching said front and back surfaces of said wafer for removing a second predetermined thickness of material therefrom after said step of heating; and
   polishing said front surface of said wafer for removing a third predetermined thickness of material from said front surface after said step of etching.

2. A method according to claim 1 wherein said step of lapping comprises the step of making said surfaces substantially parallel and removing approximately 35–40 microns of material therefrom.

3. A method according to claim 2 wherein said step of lapping comprises the step of making said surfaces parallel to within approximately 2 microns of each other.

4. A method according to claim 1 wherein said step of heating comprises the step of heating said wafer at a predetermined temperature approximately equal to or higher than the temperature to which said wafer will be heated in subsequent processing thereof.

5. A method according to claim 4 wherein said step of heating comprises the step of heating said wafer at a temperature of approximately 1,250° C. for approximately one hour.

6. A method according to claim 1 wherein said step of etching comprises the step of removing approximately 30 microns of material from said front and back surfaces.

7. A method according to caim 6 wherein said step of etching comprises the step of etching said surfaces using a conventional silicon etching material.

8. A method according to claim 7 wherein said conventional silicon etching material comprises a composition comprising nitric acid, hydrogen fluoride and acetic acid.

9. A method according to claim 1 wherein said step of polishing comprises the step of removing approximately 20 microns of material from said front surface.

10. A method according to claim 9 wherein said step of removing comprises the step of removing said material using a conventional silicon polishing material.

* * * * *